(12) United States Patent
Debashis et al.

(10) Patent No.: US 12,433,172 B2
(45) Date of Patent: Sep. 30, 2025

(54) SPIN-ORBIT READOUT USING TRANSITION METAL DICHALCOGENIDES AND PROXIMITIZED GRAPHENE

(71) Applicant: Intel Corporation, Santa Clara, CA (US)

(72) Inventors: Punyashloka Debashis, Hillsboro, OR (US); Hai Li, Portland, OR (US); Chia-Ching Lin, Portland, OR (US); Dmitri Evgenievich Nikonov, Beaverton, OR (US); Ian Alexander Young, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 673 days.

(21) Appl. No.: 17/709,074

(22) Filed: Mar. 30, 2022

(65) Prior Publication Data

US 2023/0320230 A1 Oct. 5, 2023

(51) Int. Cl.
| | |
|---|---|
| *H10N 50/85* | (2023.01) |
| *H03K 19/18* | (2006.01) |
| *H10B 61/00* | (2023.01) |
| *H10N 50/20* | (2023.01) |
| *H10N 50/80* | (2023.01) |
| *H10N 52/00* | (2023.01) |
| *H10N 52/01* | (2023.01) |
| *H10N 52/80* | (2023.01) |
| *H10N 59/00* | (2023.01) |

(52) U.S. Cl.
CPC ............ *H10N 50/85* (2023.02); *H10B 61/22* (2023.02); *H10N 50/20* (2023.02); *H10N 50/80* (2023.02); *H10N 52/01* (2023.02); *H10N 52/101* (2023.02); *H10N 52/80* (2023.02); *H10N 59/00* (2023.02); *H03K 19/18* (2013.01)

(58) Field of Classification Search
CPC ........ H10N 50/85; H10N 50/20; H10N 50/80; H10N 59/00; G11C 11/161; G11C 11/1673; H01F 10/329
See application file for complete search history.

(56) References Cited

U.S. PATENT DOCUMENTS

| | | | |
|---|---|---|---|
| 10,749,104 B2 * | 8/2020 | Liu | H03K 19/18 |
| 11,393,515 B2 * | 7/2022 | Lin | G11C 11/1675 |
| 11,557,717 B2 * | 1/2023 | Lin | G11C 11/1673 |
| 12,009,018 B2 * | 6/2024 | Lin | G11C 11/1675 |
| 2017/0243917 A1 | 8/2017 | Manipatruni et al. | |
| 2019/0259935 A1 | 8/2019 | Chawla et al. | |
| 2019/0325932 A1 | 10/2019 | Manipatruni et al. | |

(Continued)

OTHER PUBLICATIONS

Cao, Ting et al., "Valley-Selective Circular Dichroism of Monolayer Molybdenum Disulphide," Nature Communicaitons, 3:887, (2012) Macmillan Publishers Limited (5 pages).

(Continued)

*Primary Examiner* — Jose R Diaz
(74) *Attorney, Agent, or Firm* — Alliance IP, LLC

(57) ABSTRACT

In one embodiment, an integrated circuit die includes: a first layer comprising a magnetoelectric material; a second layer comprising a monolayer transition metal dichalcogenide (TMD); a magnet between the first layer and the second layer, wherein the magnet has perpendicular magnetic anisotropy; a first conductive trace coupled to the first layer; and a second conductive trace coupled to the magnet.

20 Claims, 8 Drawing Sheets

(56) References Cited

U.S. PATENT DOCUMENTS

| | | |
|---|---|---|
| 2019/0386120 A1 | 12/2019 | Lin et al. |
| 2019/0386208 A1* | 12/2019 | Lin .................... H10N 50/10 |
| 2019/0386662 A1 | 12/2019 | Lin et al. |
| 2020/0091414 A1 | 3/2020 | Liu et al. |
| 2020/0098410 A1 | 3/2020 | Gosavi et al. |
| 2020/0134419 A1 | 4/2020 | Manipatruni et al. |
| 2020/0161535 A1 | 5/2020 | Lin et al. |
| 2020/0194663 A1 | 6/2020 | Liu et al. |
| 2020/0211608 A1 | 7/2020 | Manipatruni et al. |
| 2020/0402560 A1 | 12/2020 | Thirumala et al. |

OTHER PUBLICATIONS

Liu, Huichu et al., "Synchronous Circuit Design With Beyond-CMOS Magnetoelectric Spin-Orbit Devices Toward 100-mV Logic," IEEE vol. 5, No. 1, Jun. 2019 (9 pages).

Manipatruni, Sasikanth et al., "Spin-Orbit Logic with Magnetoelectric Switching: A Multi-Generation Scalable Charge Mediated Non-Volatile Spintronic Logic," eprint arXiv: 1512.05428; Dec. 2015 (60 pages).

Manipatrunil, Sasikanth et al., "Scalable Energy-Efficient Magnetoelectric Spin-Orbit Logic," Nature, 2018 Spinger Nature Limited, Dec. 3, 2018 (9 pages).

Ngo, Duc-The et al., "Perpendicular Magnetic Anisotropy and Magnetization Process in CoFeB/Pd Multilayer Films," Journal of Physics D Applied Physics 47(44), Jun. 2014 (18 pages).

Vitale, Steven A., "Valleytronics: Opportunities, Challenges, and Paths Forward," Nano Micro Small, Small 2018, 1801483 (15 pages).

Xiao, Di et al., "Coupled Spin and Valley Physics in Monolayers of MoS2 and Other Group-VI Dichalcogenides," Phys. Rev. Lett. vol. 108, 196802 (2012), May 8, 2012 (5 pages).

Yuan, Noah F.Q., "Ising Superconductivity in Transition Metal Dichalcogenides," Department of Physics, Hong Kong University of Science and Technology, (May 2016) (9 pages).

Zhou, Benjamin T., "Spin-Orbit Coupling Induced Valley Hall Effects In Transition-Metal Dichalcogenides," Communications Physics, (2019) 2:26 (7 pages).

* cited by examiner

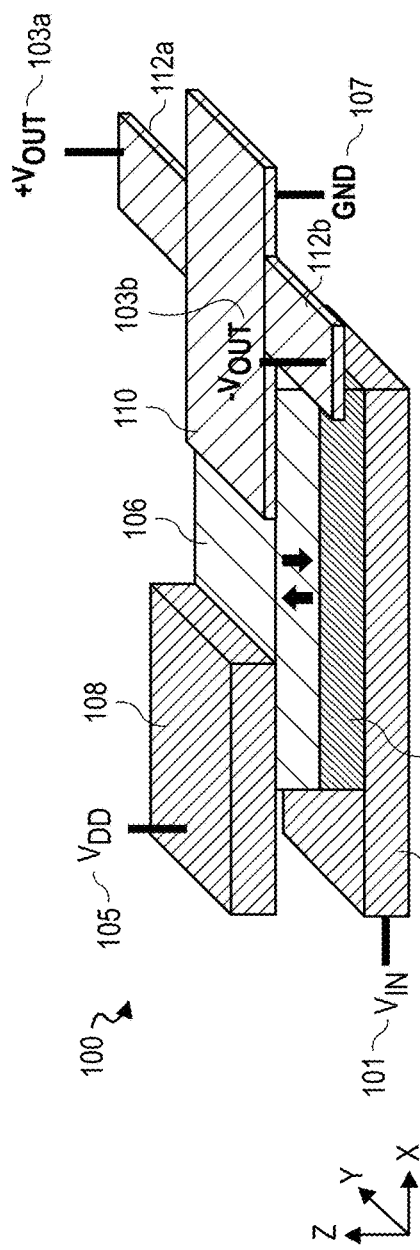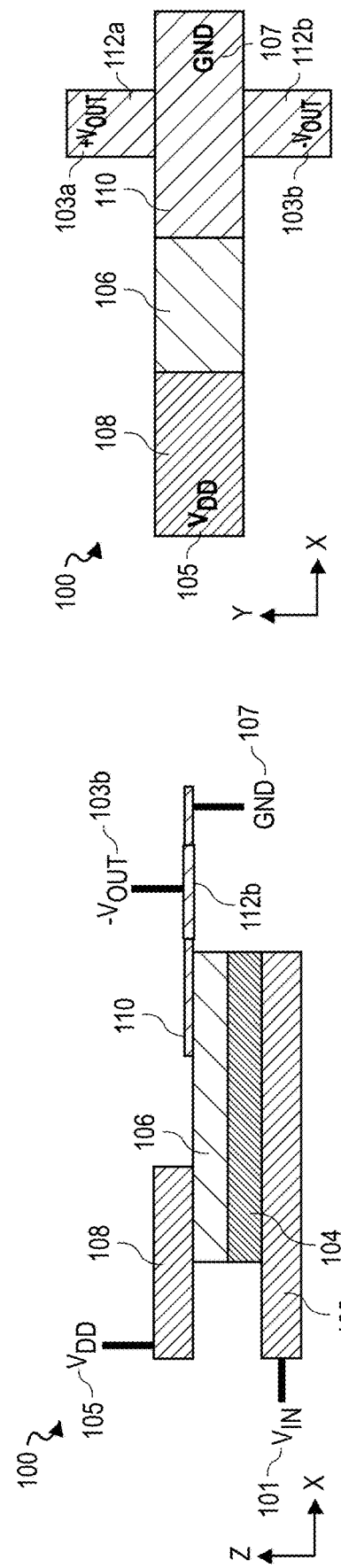

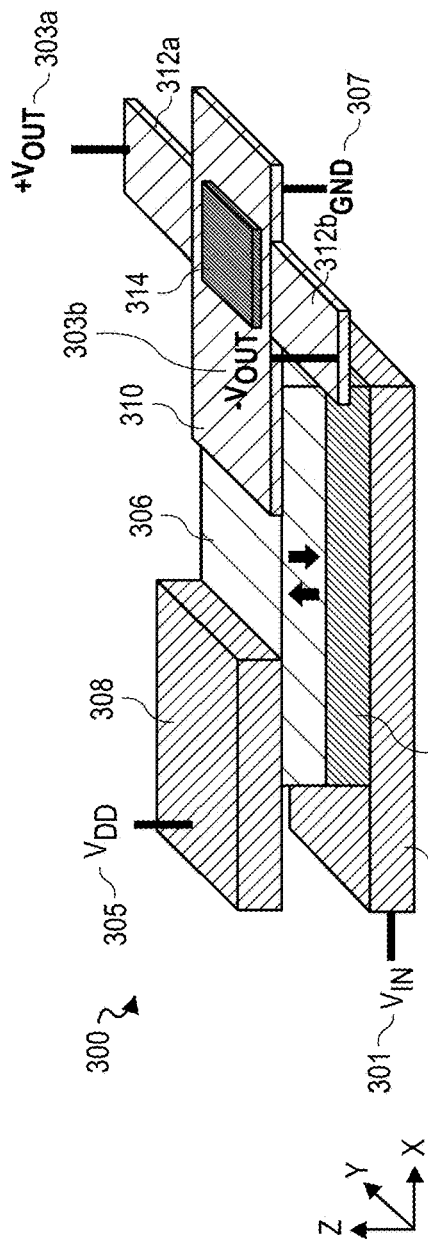
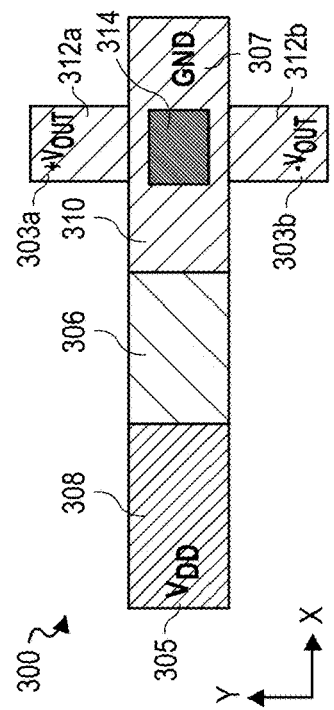
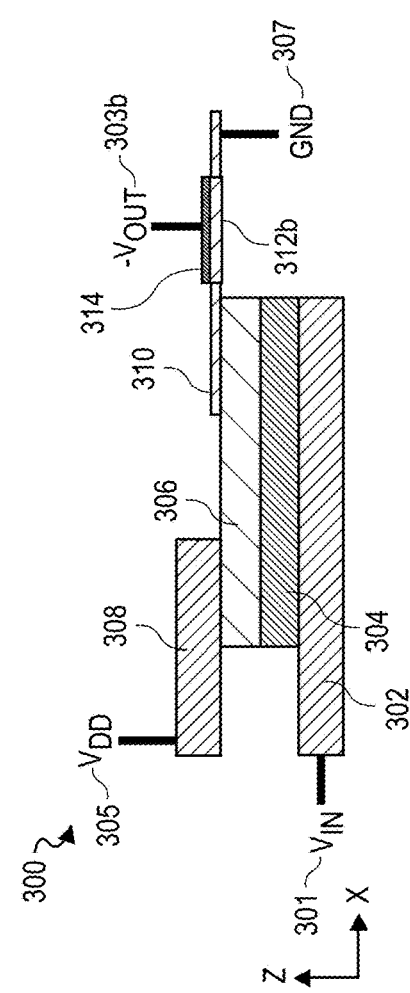
FIG. 3A
FIG. 3C
FIG. 3B

SPIN-ORBIT READOUT USING TRANSITION METAL DICHALCOGENIDES AND PROXIMITIZED GRAPHENE

BACKGROUND

Magnetoelectric spin-orbit (MESO) logic is a type of spintronic logic that operates using the magnetoelectric effect in conjunction with the spin-orbit coupling effect (e.g., the coupling of an electron's inherent angular momentum with its translational orbital motion). For example, magnetoelectric switching is used to convert an input voltage/charge into a magnetic spin state (e.g., charge-to-spin conversion), and spin-orbit transduction is used to convert the magnetic spin state back into an output charge/voltage (e.g., spin-to-charge conversion). Existing designs of MESO logic devices produce a relatively small output signal, however, which makes it challenging to cascade MESO devices together to form large-scale integrated circuits. In addition, the spin-to-charge conversion in these designs requires the injected spin polarization to be in plane, which limits the choice of ferromagnet to those with in-plane anisotropy.

BRIEF DESCRIPTION OF THE DRAWINGS

FIGS. 1A-C illustrate an example embodiment of a magnetoelectric spin-orbit (MESO) logic device with a perpendicular magnetic anisotropy (PMA) ferromagnet and a p-type monolayer transition metal dichalcogenide (TMD) for spin-to-charge conversion.

FIGS. 3A-C illustrate an example embodiment of a MESO logic device with a PMA ferromagnet and proximitized graphene for spin-to-charge conversion.

DETAILED DESCRIPTION

Figure 2A:
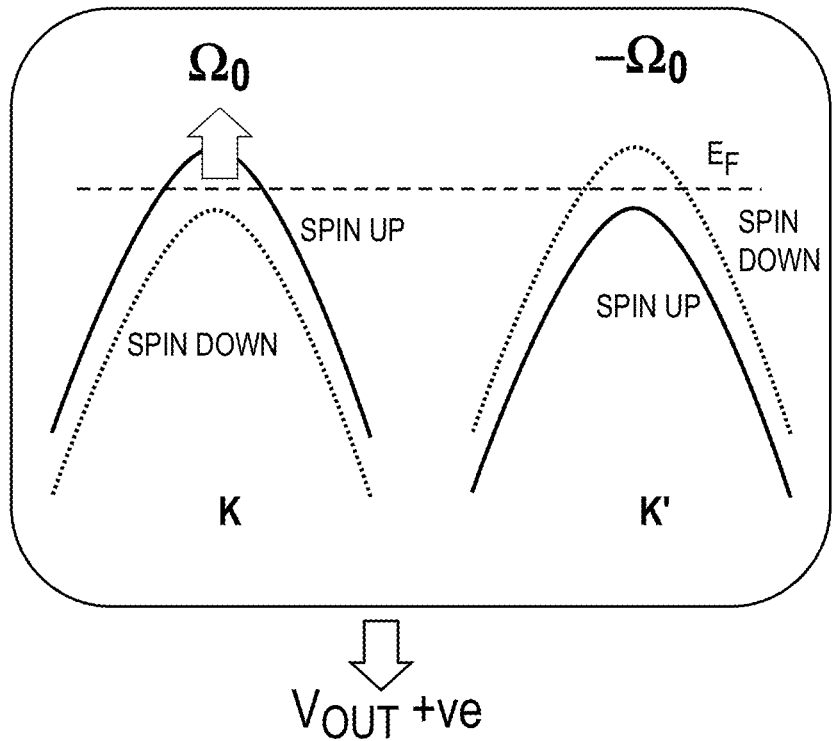
FIGS. 2A-B illustrate an example of the valley Hall effect in a p-type monolayer TMD for spin-to-charge conversion in a MESO logic device.

Spintronic logic refers to a class of semiconductor devices that leverage the physical properties of magnetization—such as the spin of electrons and their magnetic moments—to represent and manipulate data. As an example, the magnetic spin state of electrons can be used to represent logic states, logic values, bits, compute variables, and so forth.

Magnetoelectric spin-orbit (MESO) logic is a type of spintronic logic that operates using the magnetoelectric effect in conjunction with the spin-orbit coupling effect (e.g., the coupling of an electron's inherent angular momentum with its translational orbital motion). In particular, the magnetoelectric effect is used to control or manipulate the spin state of a magnet, and the spin-orbit coupling effect is used to read out the spin state of the magnet. For example, magnetoelectric switching can be used to convert charge produced by an input voltage into a magnetic spin state (e.g., charge-to-spin conversion), and spin-orbit transduction can be used to convert the magnetic spin state back into charge (e.g., spin-to-charge conversion) to produce an output voltage.

In some embodiments, for example, MESO logic can be used to implement a non-volatile logic device, such as a logic switch/gate with a non-volatile logical state. For example, a MESO logic device can convert a logical state represented by an input voltage/charge into a (non-volatile) magnetic spin state, and then subsequently convert the magnetic spin state back into an output charge/voltage to read out the logical state. Moreover, since the magnetic spin state is non-volatile, the logical state is preserved when power is switched off, which means a MESO logic device is extremely energy efficient.

As a result, MESO logic devices are a super-energy-efficient alternative to complementary metal-oxide-semiconductor (CMOS) logic devices (e.g., CMOS transistors). For example, analogous to CMOS devices, MESO logic devices can be used to implement logic circuitry in scalable integrated circuits. Compared to CMOS technology, however, MESO logic has superior energy efficiency (e.g., lower energy consumption for switching, which translates into lower operating voltage), higher integration density and efficiency (e.g., more logic functions per unit area, fewer devices required per logic function), and non-volatility (e.g., which counteracts leakage power and enables ultralow standby power).

One of the challenges associated with designing MESO logic, however, is ensuring that the output signal of one MESO device is large enough to drive the input of other MESO devices. For example, MESO logic is typically implemented as a collection of cascaded MESO devices, where the output of one MESO device serves as the input to one or more other MESO devices. As a result, the output signal of each MESO device needs to be high enough to drive the input signal to the next MESO device(s). The output power of a MESO device is dependent on the efficiency of the spin-to-charge conversion readout, however, which has been a limiting factor for building higher-order majority gates, improving fan-out efficiency, and reducing the drive current required per gate of MESO logic. In particular, during the spin-to-charge conversion, most spins dissipate at the interface of the spin-orbit (SO) module and the magnet due to scattering, conductance mismatch, and lattice mismatch, which dramatically lowers the output signal.

For example, the spin-to-charge conversion is typically achieved by converting an in-plane magnetization direction into an output charge voltage using the inverse Rashba-Edelstein effect (IREE) and/or inverse spin Hall effect (ISHE) in materials with high spin-orbit coupling, such as tantalum (Ta), platinum (Pt), tungsten (W), and/or topological insulators. However, because these spin-orbit materials have a non-zero spin Hall angle ($\theta_{SH}$) and a small spin diffusion length ($\lambda_s$), they produce a small output voltage, as the magnitude of the output voltage depends on the product of the spin Hall angle ($\theta_{SH}$) and the spin diffusion length ($\lambda_s$) ($\theta_{SH}*\lambda_s$). Further, because the spin-to-charge conversion in these materials requires the injected spin polarization to be in plane, the choice of ferromagnet is limited to those with in-plane anisotropy.

Accordingly, this disclosure presents various embodiments of MESO devices that leverage alternative material stacks to increase the output voltage and enable the use of magnets with perpendicular magnetic anisotropy (PMA). For example, the spin-coupled valley Hall effect in p-type transition metal dichalcogenides (TMDs) and/or proximitized graphene may be used to perform the spin-to-charge conversion to read out the state of the MESO device. These designs improve the output voltage compared to prior designs due to the higher spin Valley diffusion length ($\lambda_s$) and the higher spin Hall angle ($\theta_{SH}$) in these materials.

In some embodiments, for example, a two-dimensional (2D) material with the valley Hall effect and spin splitting in the valleys—such as a p-type monolayer TMD—is used to transduce injected spin currents into output charge voltages. Utilizing the valley Hall effect in 2D materials results in higher output voltage ($V_{OUT}$) due to a larger output impedance of the spin-orbit (SO) read out module, which results from the large spin-valley diffusion length ($\lambda_s$) of 2D materials. For example, the product of the spin Hall angle ($\theta_{SH}$) and spin diffusion length ($\lambda_s$)—which determines the output voltage—is larger for these 2D materials compared to heavy metals used in prior designs.

In other embodiments, proximitized graphene (e.g., monolayer graphene or a few layers of graphene proximitized by TMDs or heavy metal oxides) is used to transduce injected spin currents into output charge voltages.

The spin-orbit materials used in these various embodiments also enable the use of a magnet with perpendicular magnetic anisotropy (PMA), which is better for scaling purposes, as the magnet area can be made smaller for the same energy barrier ($E_B$) compared to an in-plane magnet. For example, if the size of the magnet in a MESO device is scaled down, the magnet still needs to remain stable for the device to function properly, which depends on the resulting energy barrier of the magnet. PMA magnets tend to have a larger energy barrier than in-plane magnets of the same size/volume, as larger anisotropies can be engineered for PMA magnets. As a result, a smaller PMA magnet that achieves the same energy barrier as a larger in-plane magnet can be used to scale down the size of a MESO device without impacting performance.

FIGS. 1A-C illustrate an example embodiment of a magnetoelectric spin-orbit (MESO) logic device 100 with a perpendicular magnetic anisotropy (PMA) ferromagnet and a p-type monolayer transition metal dichalcogenide (TMD) for spin-to-charge conversion. In particular, three-dimensional (3D), cross-section, and top-down views of the MESO device 100 are shown in FIGS. 1A, 1B, and 1C, respectively.

In the illustrated embodiment, MESO device 100 includes a magnetoelectric (ME) layer 104, a perpendicular magnetic anisotropy (PMA) ferromagnet 106, and a spin-orbit (SO) readout layer 110. MESO device 100 also includes an input voltage ($V_{IN}$) terminal 101, differential output voltage (+−$V_{OUT}$) terminals 103a-b, a supply voltage ($V_{DD}$) terminal 105, a ground (GND) terminal 107, and conductive traces or interconnects 102, 108 corresponding to the respective input voltage ($V_{IN}$) and supply voltage ($V_{DD}$) terminals 101, 105.

The $V_{IN}$ terminal 101 is coupled to the $V_{IN}$ interconnect 102, the magnetoelectric (ME) layer 104 is above at least a portion of the $V_{IN}$ interconnect 102, and the PMA magnet 106 is above the ME layer 104, such that the ME layer 104 is positioned between the $V_{IN}$ interconnect 102 and the PMA magnet 106. In addition, the $V_{DD}$ terminal 105 is coupled to the $V_{DD}$ interconnect 108, and the $V_{DD}$ interconnect 108 is positioned above, and extends partially over, one end of the PMA magnet 106. The spin-orbit (SO) readout layer 110 is also positioned above, and extends partially over, the other end of the PMA magnet 106. The SO layer 110 further includes output legs 112a-b on each side that extend laterally from, and substantially perpendicular to, the rest of SO layer 110, and the outer ends of the output legs 112a-b are coupled to the respective differential +−$V_{OUT}$ terminals 103a-b. The SO layer 110 is further coupled to the ground terminal 107.

The input voltage ($V_{IN}$) 101 controls the direction of magnetization induced on the magnet 106, and the supply voltage ($V_{DD}$) 105 causes the direction of magnetization to be read out from the magnet 106 as a transverse output voltage (+−$V_{OUT}$) 103a-b. For example, when an input voltage ($V_{IN}$) 101 is applied, the magnetoelectric (ME) layer 104 performs charge-to-spin conversion to convert the electric charge current from the input voltage ($V_{IN}$) into a magnetic spin state (e.g., a particular direction of magnetization) in the PMA magnet 106. When a supply voltage ($V_{DD}$) 105 is applied, the spin-orbit (SO) layer 110 performs spin-to-charge conversion to convert the magnetic spin state (e.g., the direction of magnetization) in the PMA magnet 106 back into an electric charge current, which produces a transverse output voltage (+−$V_{OUT}$) 103a-b on the perpendicular output legs 112a-b due to the valley-coupled spin Hall effect, as described further below.

In the illustrated embodiment, for example, when an input voltage ($V_{IN}$) is applied via the $V_{IN}$ terminal 101, charge current flows through the $V_{IN}$ interconnect 102 and into the ME layer 104, which causes the ME layer 104 to induce a particular direction of magnetization in the PMA magnet 106. In particular, the ME layer 104 is made from a material that has both ferroelectric properties (e.g., it can be electrically polarized with or without an applied electric field) and magnetic properties (e.g., it can exhibit ferromagnetic or anti-ferromagnetic order that can be switched by applying an external electric field). Moreover, the ME layer 104 is configured as a magnetoelectric (ME) capacitor in the illustrated embodiment, with the $V_{IN}$ interconnect 102 and magnet 106 serving as the electrical plates surrounding the ME capacitor layer 104. In this manner, when the input voltage ($V_{IN}$) is applied, the ferroelectric polarization of the ME layer 104 switches direction depending upon the sign of $V_{IN}$. This causes the anti-ferromagnetic order parameter to switch in the ME layer 104. As a result of this, due to the proper exchange bias and exchange coupling between this anti-ferromagnetic order in the ME layer 104 and the ferromagnetic order in the PMA magnet 106, the magnetization direction of the PMA magnet 106 switches. Since the PMA magnet 106 has perpendicular magnetic anisotropy, the direction of magnetization is perpendicular-to-plane (e.g., out-of-plane) in either the +−Z direction (as shown in FIGS. 1A-C) depending on the polarity of the input voltage ($V_{IN}$) and corresponding ferroelectric polarization in the ME layer 104. As a result, the direction of magnetization in the magnet 106 can be controlled or switched by reversing the polarity of the input voltage ($V_{IN}$) (e.g., by applying either positive or negative input voltage). Moreover, due to its ferromagnetic properties, the magnet 106 retains the induced direction of magnetization even after the input voltage ($V_{IN}$) is switched off (e.g., it is non-volatile).

In order to read out the direction of magnetization induced on the PMA magnet 106, a supply voltage ($V_{DD}$) is applied via the $V_{DD}$ terminal 105, causing charge current to flow through the $V_{DD}$ interconnect 108 and into the magnet 106, which in turn causes the magnet 106 to produce spin polarized current whose spin polarization aligns with the direction of magnetization in the magnet 106. The spin polarized current in the magnet 106 is then injected into the spin-orbit (SO) readout layer 110, where the valley-coupled spin Hall effect converts the spin polarized current into charge current that flows in a perpendicular direction along the output legs 112a-b of the SO layer 110, which produces a transverse output voltage (+−$V_{OUT}$) at the +−$V_{OUT}$ terminals 103a-b. The polarity of the output voltage (+−$V_{OUT}$) indicates the direction of magnetization of the magnet 106, which serves as the output of the MESO device 100.

In the illustrated embodiment, for example, the spin-orbit (SO) readout layer 110—which is used to perform the spin-to-charge conversion—is formed of a p-type monolayer transition metal dichalcogenide (TMD) material, such as tungsten diselenide ($WSe_2$) or tungsten disulfide ($WS_2$). The non-zero finite Berry curvature of p-type monolayer TMD materials, such as $WSe_2$ and $WS_2$, results in a transverse velocity of charge carriers depending upon their valley degree of freedom. This results in a valley-coupled spin Hall effect (VSHE), also referenced herein as the valley Hall effect (VHE), where a valley polarized current produces a net flow of charge current in a perpendicular direction (e.g., out-of-plane). In the illustrated embodiment, for example, the net flow of charge current flows along the perpendicular output legs 112a-b of the SO layer 110, which produces a voltage difference across the differential output voltage terminals (+−$V_{OUT}$) 103a-b on the respective ends of the output legs 112a-b.

For example, in $WSe_2$ and $WS_2$, the valence band has a spin split on the order of 450 millivolts (mV). In these materials, chosen valleys can be populated by controlling the spin polarization direction of the injected charge carriers, which is accomplished by applying a positive or negative input voltage ($V_{IN}$) 101 to switch the direction of magnetization of the ferromagnet 106. Depending upon the valley being populated, the output charge voltage (+−$V_{OUT}$) 103a-b changes sign due to the aforementioned valley Hall effect (VHE). As a result, switching the direction of magnetization of the ferromagnet 106 via the applied input voltage ($V_{IN}$) 101 translates into a change in the output voltage (+−$V_{OUT}$) 103a-b. The valley Hall effect is described in further detail in connection with FIGS. 2A-B.

Moreover, since the valley Hall effect occurs for out-of-plane polarized spins, the ferromagnet 106 is one with perpendicular magnetic anisotropy (PMA) rather than in-plane magnetic anisotropy. This is beneficial for scaling purposes, as PMA magnets can be designed, through surface anisotropy engineering, to have a larger energy barrier than in-plane magnets of the same size or volume, which means the size of the PMA magnet 106 can be reduced relative to an in-plane magnet while still providing the same energy ($E_B$) barrier.

The magnetoelectric (ME) layer 104 may be formed of any suitable magnetoelectric and/or multiferroic material(s), including, but not limited to: (i) multiferroics such as bismuth ferrite (BFO) (e.g., $BiFeO_3$), lanthanum doped bismuth ferrite (e.g., $LaBiFeO_3$), samarium doped bismuth ferrite (e.g., $SmBiFeO_3$), lutetium ferrite (LFO) (e.g., $LuFeO_2$, $LuFeO_3$, $LuFe_2O_4$), $TbMnO_3$, and other multiferroic oxides; (ii) magnetostrictive materials such as $Fe_3Ga$, $Tb_xDy_{1-x}Fe_2$, FeRh; (iii) electrically tuned exchange-mediated magnetoelectrics such as $Cr_2O_3$ and $Fe_2TeO_6$; and/or (iv) any other suitable materials with magnetoelectric properties, such as $BiTiO_3$, lead zirconate titanate (PZT), lead magnesium niobate-lead titanate (PMN-PT), and aluminum nitride (AlN).

The PMA ferromagnet 106 may be formed of any ferromagnetic material(s) with perpendicular magnetic anisotropy (PMA), including, but not limited to, metal/oxide heterostructures (e.g., CoFeB/MgO and other CoFeB-based heterostructures and films), Co-based multilayer materials (e.g., multilayer Co/Pt, Co/Pd, CoFe/Pd, Co/Ni), two-dimensional (2D) materials (e.g., GaTe, FeGaTe, CrGaTe), $L1_0$ materials (e.g., $L1_0$ single-layer materials such as MnGa, CoPt, FePt, and other materials with $L1_0$ symmetry), and/or rare earth-transition metal amorphous materials (e.g., TbFeCo, GdFeCo).

The spin-orbit (SO) readout layer 110 may be formed of any suitable transition metal dichalcogenide (TMD) material(s) (e.g., with spin splitting in the valleys), including any of the p-type monolayer TMD materials disclosed herein, such as tungsten diselenide ($WSe_2$) or tungsten disulfide ($WS_2$), among other examples.

The conductive traces or interconnects 102, 108, and the terminals, electrodes, or contacts corresponding to the input voltage ($V_{in}$) 101, output voltage (+−$V_{out}$) 103a-b, supply voltage ($V_{DD}$) 105, and/or ground (GND) 107, may be formed of any suitable conductive material(s), including, but not limited to, copper (Cu), silver (Ag), aluminum (Al), gold (Au), cobalt (Co), tungsten (W), tantalum (Ta), nickel (Ni), other metals, and/or graphene.

Further, in various embodiments, MESO device 100 may be implemented using other types, numbers, and/or arrangements of components, materials, and/or layers than shown in FIGS. 1A-C. For example, certain components of MESO device 100 may be added, replaced, omitted, and/or rearranged.

Figure 2B:
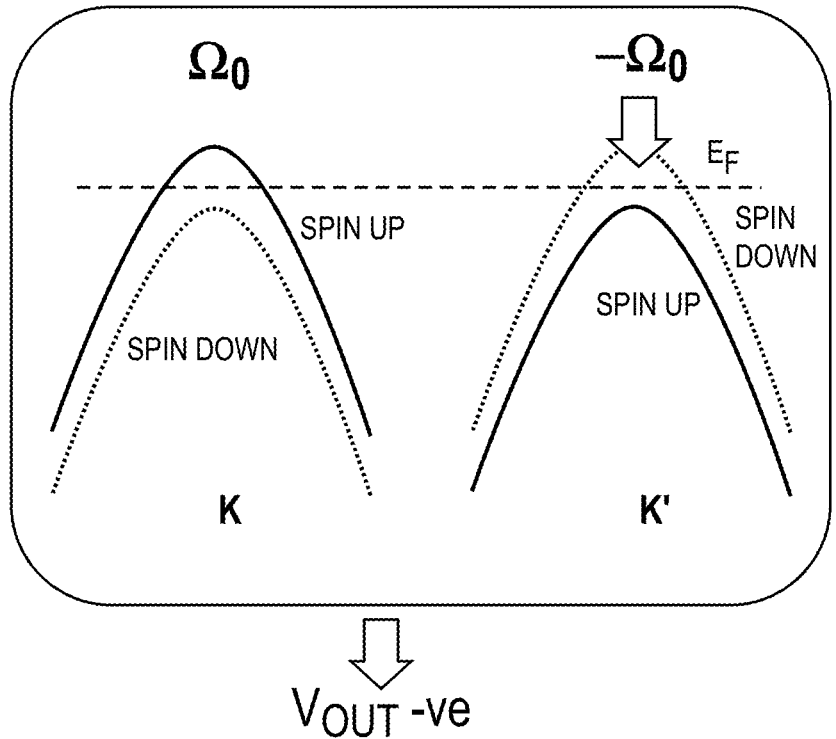

FIGS. 2A-B illustrate an example of the valley Hall effect in a p-type monolayer transition metal dichalcogenide (TMD) for spin-to-charge conversion in a magnetoelectric spin-orbit (MESO) logic device. In particular, a monolayer or two-dimensional (2D) material is a material formed of a single layer of closely-packed atoms, molecules, or cells. A monolayer transition metal dichalcogenide (TMD) is an atomically thin semiconductor of the type $MX_2$, where M is a transition-metal atom (e.g., tungsten (W)) and X is a chalcogen atom (e.g., selenium (Se), sulfur (S)), and one layer of M atoms is sandwiched between two layers of X atoms.

Moreover, the crystal structure of a monolayer TMD material has no inversion center (e.g., inversion symmetry is explicitly broken), which gives rise to the valley Hall effect, where carriers in different valleys flow to opposite transverse edges when an electric field is applied. For example, the strong spin-orbit coupling in a monolayer TMD leads to a spin-orbit splitting in the valence band on the order of 450 millivolts (mV). As a result, the K valleys in the valence band exhibit different behavior and are no longer equivalent, which leads to distinct K and K' valleys in the valance band. This phenomenon can be leveraged for control over a new degree of freedom of charge carriers, namely the electron valley degree of freedom or k-valley index, referred to as "valleytronics."

For example, FIGS. 2A-B show how control over the valley degree of freedom of charge carriers can be leveraged for spin-to-charge conversion in MESO device 100. In particular, the K and K' valleys are split into sub-bands with an energy difference on the order of 450 mV based on the spin state (e.g., spin up versus spin down). For example, in the K valley, spin up has higher energy than spin down, while in the K' valley, spin down has higher energy than spin up. Moreover, chosen valleys can be populated by controlling the spin polarization direction of the injected charge carriers. In MESO device 100, for example, this is accomplished by switching the direction of magnetization of the ferromagnet 106 based on the polarity of the applied input voltage ($V_{IN}$). Depending upon the valley being populated, the output charge voltage (+–$V_{OUT}$) changes sign due to the valley Hall effect (VHE).

For example, FIG. 2A depicts the output of MESO device 100 when the magnetization direction of the PMA magnet 106 points up, while FIG. 2B depicts the output of MESO device 100 when the magnetization direction of the PMA magnet 106 points down. In FIG. 2A, when the magnetization direction points up, spin current with spin polarization in the up direction is injected into the K valley, and the valley Hall effect produces a transverse output voltage ($V_{OUT}$) with positive polarity. In FIG. 2B, when the magnetization direction points down, spin current with spin polarization in the down direction is injected into the K' valley, and the valley Hall effect produces a transverse output voltage ($V_{OUT}$) with negative polarity. In this manner, the polarity of the output voltage ($V_{OUT}$) changes based on the direction of magnetization of the magnet 106, which can be controlled or switched based on the applied input voltage ($V_{IN}$).

FIGS. 3A-C illustrate an example embodiment of a magnetoelectric spin-orbit (MESO) logic device 300 with a perpendicular magnetic anisotropy (PMA) ferromagnet and proximitized graphene for spin-to-charge conversion. In particular, three-dimensional (3D), cross-section, and top-down views of the MESO device 300 are shown in FIGS. 3A, 3B, and 3C, respectively.

In the illustrated embodiment, MESO device 300 includes a magnetoelectric (ME) layer 304, a perpendicular magnetic anisotropy (PMA) ferromagnet 306, and a spin-orbit (SO) readout layer 310 with perpendicular output legs 312a-b. MESO device 300 also includes an input voltage ($V_{IN}$) terminal 301, differential output voltage (+–$V_{OUT}$) terminals 303a-b, a supply voltage ($V_{DD}$) terminal 305, a ground (GND) terminal 307, and conductive traces or interconnects 302, 308 corresponding to the respective input voltage ($V_{IN}$) and supply voltage ($V_{DD}$) terminals 301, 305.

The configuration of MESO device 300 (e.g., the arrangement of components, materials, and overall operation) is similar to MESO device 100 of FIGS. 1A-C, with the exception of the spin-orbit (SO) readout layer 310. In particular, in MESO device 300, the SO layer 310 is formed of a proximitized graphene heterostructure. For example, the SO layer 310 may be formed of monolayer graphene or a few layers of graphene, proximitized by one or more layers 314 of another material, such as a transition metal dichalcogenide (TMD) (e.g., $WSe_2$) or an oxidized heavy metal (e.g., $TaO_x$, $BiO_x$, $WO_x$). In the illustrated embodiment, for example, the graphene-based SO layer 310 includes a patch of one or more layers 314 of TMD or oxidized heavy metal material(s), which is positioned on the upper surface of the SO layer 310 near the middle and between the respective output legs 312a-b. In this manner, the graphene-based SO layer 310 (e.g., monolayer graphene or a few layers of graphene) is proximitized by the TMD or oxidized heavy metal material(s) in the patch of layers 314, which causes the graphene-based SO layer 310 to be induced with the properties of the materials in the patch of layers 314.

In particular, the MESO output voltage from the spin-to-charge conversion is determined by the product of the spin diffusion length ($\lambda_s$) and the spin Hall angle ($\theta_{SH}$) of the material(s) used in the SO layer 310. For example, isolated graphene has a large spin diffusion length ($\lambda_s$) but a negligible spin Hall angle (NO, which results in a low output voltage. On the other hand, heavy metals—such as tantalum (Ta), tungsten (W), bismuth (Bi), and so forth—have a non-zero spin Hall angle ($\theta_{SH}$) but a very small spin diffusion length ($\lambda_s$), which also results in a low output voltage.

However, by forming the SO layer 310 of a graphene/ heavy metal oxide heterostructure, or a graphene/TMD heterostructure, the graphene is proximitized by the heavy metal oxide or the TMD. As a result, the spin-orbit properties of the heavy metal oxide or TMD are induced on the graphene layer, which increases its spin Hall angle ($\theta_{SH}$) without significantly diminishing its spin diffusion length ($\lambda_s$). In this manner, the proximitized graphene heterostructure has a larger spin Hall angle ($\theta_{SH}$) and similar spin diffusion length ($\lambda_s$) compared to isolated graphene, resulting in a larger $\theta_{SH}*\lambda_s$ product, which produces a large output voltage ($V_{OUT}$) for the MESO device 300 when performing the spin-to-charge conversion.

Moreover, the proximitized graphene heterostructure relies on the inverse Rashba-Edelstein effect or bulk spin Hall effect for spin-to-charge conversion, which produces a transverse output voltage ($V_{OUT}$) whose sign depends on the spin polarization direction of the spin polarized current, which in turn depends on the direction of magnetization in the PMA magnet 306.

Further, in various embodiments, MESO device 300 may be implemented using other types, numbers, and/or arrangements of components, materials, and/or layers than shown in FIGS. 3A-C. For example, certain components of MESO device 300 may be added, replaced, omitted, and/or rearranged.

Figure 4:
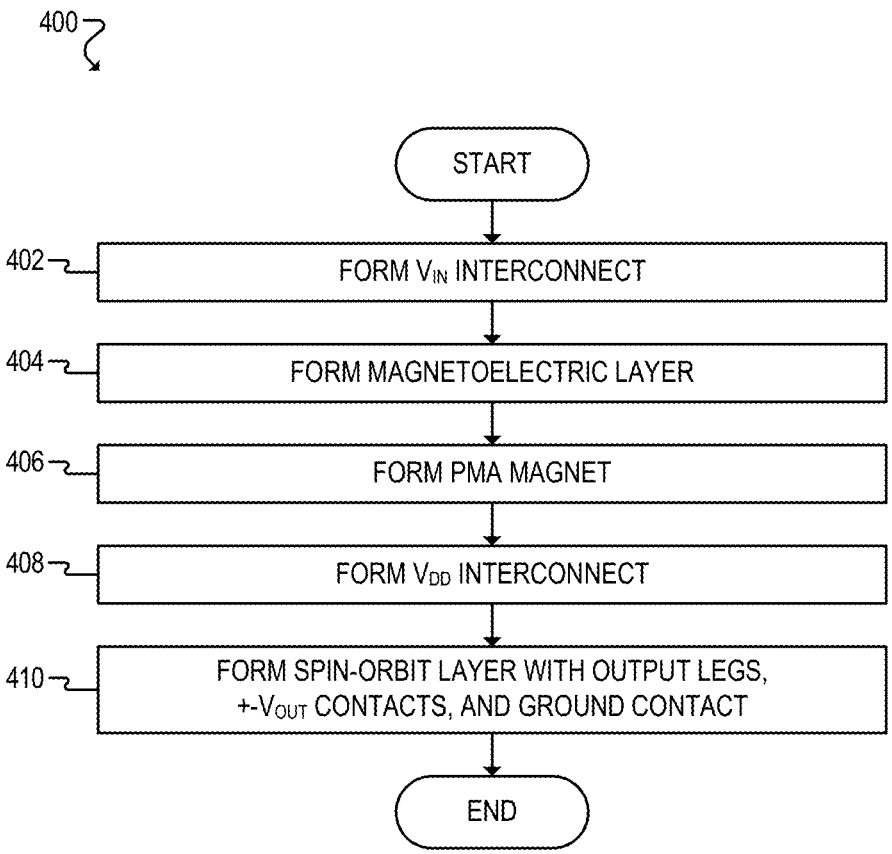
FIG. 4 illustrates a flowchart for fabricating a MESO device in accordance with certain embodiments.

FIG. 4 illustrates a flowchart 400 for fabricating MESO devices 100, 300 of FIGS. 1A-B and 3A-B in accordance with certain embodiments. It will be appreciated in light of the present disclosure that flowchart 400 is only one example methodology for arriving at the example MESO device structures shown and described throughout this disclosure. It will also be appreciated that the steps of flowchart 400 may be performed using any suitable semiconductor fabrication techniques. For example, film deposition—such as depositing layers, filling portions of layers (e.g., removed portions), and filling via openings—may be performed using any suitable deposition techniques, including, for example, chemical vapor deposition (CVD), metalorganic chemical vapor deposition (MOCVD), molecular beam epitaxy (MBE) atomic layer deposition (ALD), and/or physical vapor deposition (PVD). Moreover, patterning and removal—such as interconnect patterning, forming via openings, and shaping—may be performed using any suitable techniques, such as lithography-based patterning/masking and/or etching.

The flowchart begins at block 402 by forming a conductive trace or interconnect for an input voltage ($V_{IN}$). In some embodiments, for example, the interconnect may be patterned or etched in one or more other layers, such as layers of an inter-layer dielectric (ILD) material, and then filled using any suitable conductive material(s). For example, the interconnect may be formed from a material that includes elements such as copper (Cu), silver (Ag), aluminum (Al), gold (Au), cobalt (Co), tungsten (W), tantalum (Ta), nickel (Ni), other metals, carbon (C) (e.g., graphene), and so forth.

The flowchart then proceeds to block 404 to form a magnetoelectric (ME) layer above the conductive trace or interconnect for the input voltage ($V_{IN}$). For example, the ME layer may be formed from one or more magnetoelectric and/or multiferroic materials that include elements such as bismuth (Bi), iron (Fe), oxygen (O), lanthanum (La), lutetium (Lu), samarium (Sm), terbium (Tb), manganese (Mn), gallium (Ga), dysprosium (Dy), rhodium (Rh), chromium (Cr), tellurium (Te), titanium (Ti), lead (Pb), zirconium (Zr), magnesium (Mg), niobium (Nb), aluminum (Al), and/or nitrogen (N), among other examples. Examples of magnetoelectric materials that may be used to form the ME layer include, but are not limited to: (i) multiferroics such as bismuth ferrite (BFO) (e.g., $BiFeO_3$), lanthanum doped bismuth ferrite (e.g., $LaBiFeO_3$), samarium doped bismuth ferrite (e.g., $SmBiFeO_3$), lutetium ferrite (LFO) (e.g., $LuFeO_2$, $LuFeO_3$, $LuFe_2O_4$), $TbMnO_3$, and other multiferroic oxides; (ii) magnetostrictive materials such as $Fe_3Ga$, $Tb_xDy_{1-x}Fe_2$, FeRh; (iii) electrically tuned exchange-mediated magnetoelectrics such as $Cr_2O_3$ and $Fe_2TeO_6$; and/or (iv) any other suitable materials with magnetoelectric properties, such as $BiTiO_3$, lead zirconate titanate (PZT), lead magnesium niobate-lead titanate (PMN-PT), and aluminum nitride (AlN).

The flowchart then proceeds to block 406 to form a ferromagnet having perpendicular magnetic anisotropy (PMA) above the magnetoelectric layer. The PMA ferromagnet may be formed of one or more ferromagnetic material(s) having perpendicular magnetic anisotropy (PMA), referred to herein as PMA materials. In some embodiments, the PMA materials include elements such as cobalt (Co), iron (Fe), boron (B), magnesium (Mg), oxygen (O), platinum (Pt), palladium (Pd), nickel (Ni), gallium (Ga), tellurium (Te), chromium (Cr), manganese (Mn), terbium (Tb), and/or gadolinium (Gd), among other examples. Examples of PMA materials that may be used to form the PMA ferromagnet include, but are not limited to: metal/oxide heterostructures (e.g., CoFeB/MgO and other CoFeB-based heterostructures and films); Co-based multilayer materials (e.g., multilayer Co/Pt, Co/Pd, CoFe/Pd, Co/Ni); two-dimensional (2D) materials (e.g., GaTe, FeGaTe, CrGaTe); $L1_0$ materials (e.g., $L1_0$ single-layer materials such as MnGa, CoPt, FePt, and other materials with $L1_0$ symmetry); and rare earth-transition metal amorphous materials (e.g., TbFeCo, GdFeCo), among other examples.

The flowchart then proceeds to block 408 to form a conductive trace or interconnect for a supply voltage ($V_{DD}$) above the PMA ferromagnet. In some embodiments, for example, the $V_{DD}$ conductive trace or interconnect may be formed using similar techniques and/or materials as the $V_{IN}$ interconnect from block 402.

The flowchart then proceeds to block 410 to form a spin-orbit readout layer with perpendicular output legs, differential output voltage ($+-V_{OUT}$) contacts, and a ground (GND) contact.

In some embodiments, for example, the spin-orbit (SO) readout layer may be formed of one or more transition metal dichalcogenide (TMD) material(s), which may include elements such as tungsten (W), selenium (Se), and/or sulfur (S), among other examples. Examples of TMD materials that may be used to form the SO layer include, but are not limited to, p-type monolayer TMD materials such as tungsten diselenide ($WSe_2$) and tungsten disulfide ($WS_2$), among other examples.

In other embodiments, the spin-orbit (SO) readout layer may be formed of one or more layers of graphene (e.g., monolayer graphene or a few layers of graphene) proximitized by one or more layers of transition metal dichalcogenide (TMD) material(s) or heavy metal oxide(s), which may include elements such as carbon (C), tungsten (W), selenium (Se), sulfur (S), tantalum (Ta), bismuth (Bi), and/or oxygen (O), among other examples. Examples of TMD materials include, but are not limited to, tungsten diselenide ($WSe_2$) and tungsten disulfide ($WS_2$). Examples of heavy metal oxides include, but are not limited to, $TaO_x$, $BiO_x$, and/or $WO_x$.

At this point, the flowchart may be complete. In some embodiments, however, the flowchart may restart and/or certain blocks may be repeated. For example, in some embodiments, the flowchart may restart at block 402 to continue fabricating another MESO device with the same or similar design.

Example Integrated Circuit Embodiments

Figure 5:
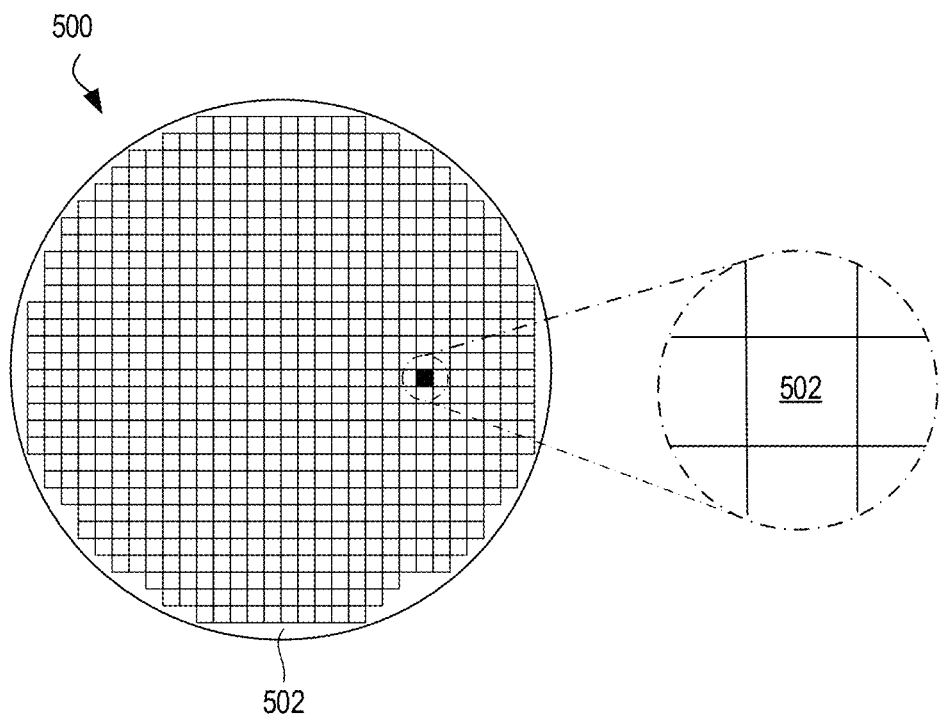
FIG. 5 is a top view of a wafer and dies that may be included in a microelectronic assembly, in accordance with any of the embodiments disclosed herein.

FIG. 5 is a top view of a wafer 500 and dies 502 that may be included in any of the embodiments disclosed herein. The wafer 500 may be composed of semiconductor material and may include one or more dies 502 having integrated circuit structures formed on a surface of the wafer 500. The individual dies 502 may be a repeating unit of an integrated circuit product that includes any suitable integrated circuit. After the fabrication of the semiconductor product is complete, the wafer 500 may undergo a singulation process in which the dies 502 are separated from one another to provide discrete "chips" of the integrated circuit product. The die 502 may be any of the dies disclosed herein. The die 502 may include one or more transistors (e.g., some of the transistors 640 of FIG. 6, discussed below), supporting circuitry to route electrical signals to the transistors, passive components (e.g., signal traces, resistors, capacitors, or inductors), and/or any other integrated circuit components. In some embodiments, the wafer 500 or the die 502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processor unit (e.g., the processor unit 802 of FIG. 8) or other logic that is configured to store information in the memory devices or execute instructions stored in the memory array. Various ones of the microelectronic assemblies disclosed herein may be manufactured using a die-to-wafer assembly technique in which some dies are attached to a wafer 500 that include others of the dies, and the wafer 500 is subsequently singulated.

Figure 6:
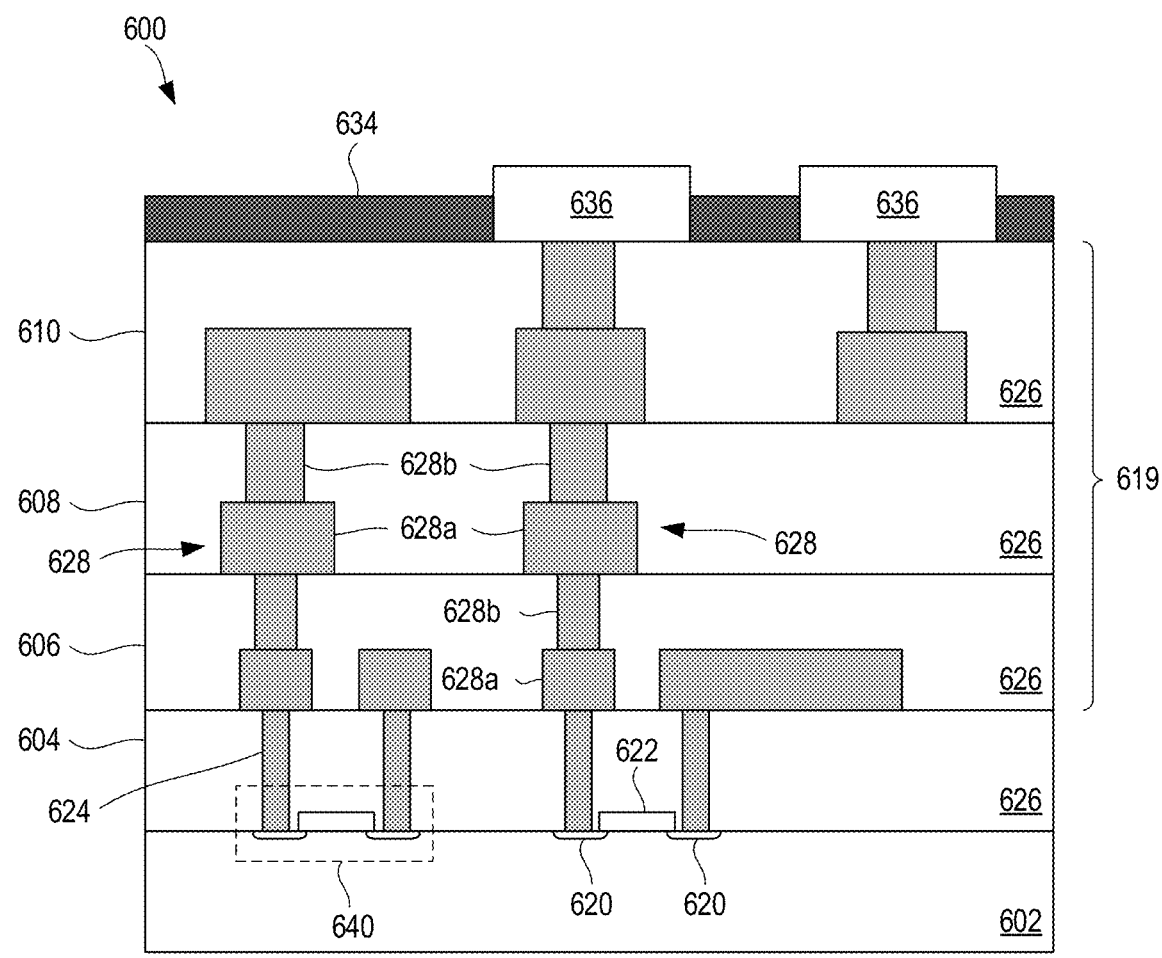
FIG. 6 is a cross-sectional side view of an integrated circuit device that may be included in a microelectronic assembly, in accordance with any of the embodiments disclosed herein.

FIG. 6 is a cross-sectional side view of an integrated circuit device 600 that may be included in any of the embodiments disclosed herein (e.g., in any of the dies). One or more of the integrated circuit devices 600 may be included in one or more dies 502 (FIG. 5). The integrated circuit device 600 may be formed on a die substrate 602 (e.g., the wafer 500 of FIG. 5) and may be included in a die (e.g., the die 502 of FIG. 5). The die substrate 602 may be a semiconductor substrate composed of semiconductor material systems including, for example, n-type or p-type materials systems (or a combination of both). The die substrate 602 may include, for example, a crystalline substrate formed using a bulk silicon or a silicon-on-insulator (SOI) substructure. In some embodiments, the die substrate 602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 602. Although a few examples of materials from which the die substrate 602 may be formed are described here, any material that may serve as a foundation for an integrated circuit device 600 may be used. The die substrate 602 may be part of a singulated die (e.g., the dies 502 of FIG. 5) or a wafer (e.g., the wafer 500 of FIG. 5).

The integrated circuit device 600 may include one or more device layers 604 disposed on the die substrate 602. The device layer 604 may include features of one or more transistors 640 (e.g., metal oxide semiconductor field-effect transistors (MOSFETs)) formed on the die substrate 602. The transistors 640 may include, for example, one or more source and/or drain (S/D) regions 620, a gate 622 to control current flow between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 6, a transistor 640 may include a gate 622 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 640 along the source-channel-drain direction, the gate electrode may consist of a U-shaped structure that includes a bottom portion substantially parallel to the surface of the die substrate 602 and two sidewall portions that are substantially perpendicular to the top surface of the die substrate 602. In other embodiments, at least one of the metal layers that form the gate electrode may simply be a planar layer that is substantially parallel to the top surface of the die substrate 602 and does not include sidewall portions substantially perpendicular to the top surface of the die substrate 602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 620 may be formed within the die substrate 602 adjacent to the gate 622 of individual transistors 640. The S/D regions 620 may be formed using an implantation/diffusion process or an etching/deposition process, for example. In the former process, dopants such as boron, aluminum, antimony, phosphorous, or arsenic may be ion-implanted into the die substrate 602 to form the S/D regions 620. An annealing process that activates the dopants and causes them to diffuse farther into the die substrate 602 may follow the ion-implantation process. In the latter process, the die substrate 602 may first be etched to form recesses at the locations of the S/D regions 620. An epitaxial deposition process may then be carried out to fill the recesses with material that is used to fabricate the S/D regions 620. In some implementations, the S/D regions 620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 620 may be formed using one or more alternate semiconductor materials such as germanium or a group III-V material or alloy. In further embodiments, one or more layers of metal and/or metal alloys may be used to form the S/D regions 620.

Electrical signals, such as power and/or input/output (I/O) signals, may be routed to and/or from the devices (e.g., transistors 640) of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form a metallization stack (also referred to as an "ILD stack") 619 of the integrated circuit device 600.

The interconnect structures 628 may be arranged within the interconnect layers 606-610 to route electrical signals according to a wide variety of designs; in particular, the arrangement is not limited to the particular configuration of interconnect structures 628 depicted in FIG. 6. Although a particular number of interconnect layers 606-610 is depicted in FIG. 6, embodiments of the present disclosure include integrated circuit devices having more or fewer interconnect layers than depicted.

In some embodiments, the interconnect structures 628 may include lines 628a and/or vias 628b filled with an electrically conductive material such as a metal. The lines 628a may be arranged to route electrical signals in a direction of a plane that is substantially parallel with a surface of the die substrate 602 upon which the device layer 604 is formed. For example, the lines 628a may route electrical signals in a direction in and out of the page and/or in a direction across the page from the perspective of FIG. 6. The vias 628b may be arranged to route electrical signals in a direction of a plane that is substantially perpendicular to the surface of the die substrate 602 upon which the device layer 604 is formed. In some embodiments, the vias 628b may electrically couple lines 628a of different interconnect layers 606-610 together.

The interconnect layers 606-610 may include a dielectric material 626 disposed between the interconnect structures 628, as shown in FIG. 6. In some embodiments, dielectric material 626 disposed between the interconnect structures 628 in different ones of the interconnect layers 606-610 may have different compositions; in other embodiments, the composition of the dielectric material 626 between different interconnect layers 606-610 may be the same. The device layer 604 may include a dielectric material 626 disposed between the transistors 640 and a bottom layer of the metallization stack as well. The dielectric material 626 included in the device layer 604 may have a different composition than the dielectric material 626 included in the interconnect layers 606-610; in other embodiments, the composition of the dielectric material 626 in the device layer 604 may be the same as a dielectric material 626 included in any one of the interconnect layers 606-610.

A first interconnect layer 606 (referred to as Metal 1 or "M1") may be formed directly on the device layer 604. In some embodiments, the first interconnect layer 606 may include lines 628a and/or vias 628b, as shown. The lines 628a of the first interconnect layer 606 may be coupled with contacts (e.g., the S/D contacts 624) of the device layer 604. The vias 628b of the first interconnect layer 606 may be coupled with the lines 628a of a second interconnect layer 608.

The second interconnect layer 608 (referred to as Metal 2 or "M2") may be formed directly on the first interconnect layer 606. In some embodiments, the second interconnect layer 608 may include via 628b to couple the lines 628 of the second interconnect layer 608 with the lines 628a of a third interconnect layer 610. Although the lines 628a and the vias 628b are structurally delineated with a line within individual interconnect layers for the sake of clarity, the lines 628a and the vias 628b may be structurally and/or materially contiguous (e.g., simultaneously filled during a dual-damascene process) in some embodiments.

The third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606. In some embodiments, the interconnect layers that are "higher up" in the metallization stack 619 in the integrated circuit device 600 (i.e., farther away from the device layer 604) may be thicker that the interconnect layers that are lower in the metallization stack 619, with lines 628a and vias 628b in the higher interconnect layers being thicker than those in the lower interconnect layers.

The integrated circuit device 600 may include a solder resist material 634 (e.g., polyimide or similar material) and one or more conductive contacts 636 formed on the interconnect layers 606-610. In FIG. 6, the conductive contacts 636 are illustrated as taking the form of bond pads. The conductive contacts 636 may be electrically coupled with the interconnect structures 628 and configured to route the electrical signals of the transistor(s) 640 to external devices. For example, solder bonds may be formed on the one or more conductive contacts 636 to mechanically and/or electrically couple an integrated circuit die including the integrated circuit device 600 with another component (e.g., a printed circuit board). The integrated circuit device 600 may include additional or alternate structures to route the electrical signals from the interconnect layers 606-610; for example, the conductive contacts 636 may include other analogous features (e.g., posts) that route the electrical signals to external components. The conductive contacts 636 may serve as any of the conductive contacts described throughout this disclosure.

In some embodiments in which the integrated circuit device 600 is a double-sided die, the integrated circuit device 600 may include another metallization stack (not shown) on the opposite side of the device layer(s) 604. This metallization stack may include multiple interconnect layers as discussed above with reference to the interconnect layers 606-610, to provide conductive pathways (e.g., including conductive lines and vias) between the device layer(s) 604 and additional conductive contacts (not shown) on the opposite side of the integrated circuit device 600 from the conductive contacts 636. These additional conductive contacts may serve as any of the conductive contacts described throughout this disclosure.

In other embodiments in which the integrated circuit device 600 is a double-sided die, the integrated circuit device 600 may include one or more through silicon vias (TSVs) through the die substrate 602; these TSVs may make contact with the device layer(s) 604, and may provide conductive pathways between the device layer(s) 604 and additional conductive contacts (not shown) on the opposite side of the integrated circuit device 600 from the conductive contacts 636. These additional conductive contacts may serve as any of the conductive contacts described throughout this disclosure. In some embodiments, TSVs extending through the substrate can be used for routing power and ground signals from conductive contacts on the opposite side of the integrated circuit device 600 from the conductive contacts 636 to the transistors 640 and any other components integrated into the die 600, and the metallization stack 619 can be used to route I/O signals from the conductive contacts 636 to transistors 640 and any other components integrated into the die 600.

Multiple integrated circuit devices 600 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 7:
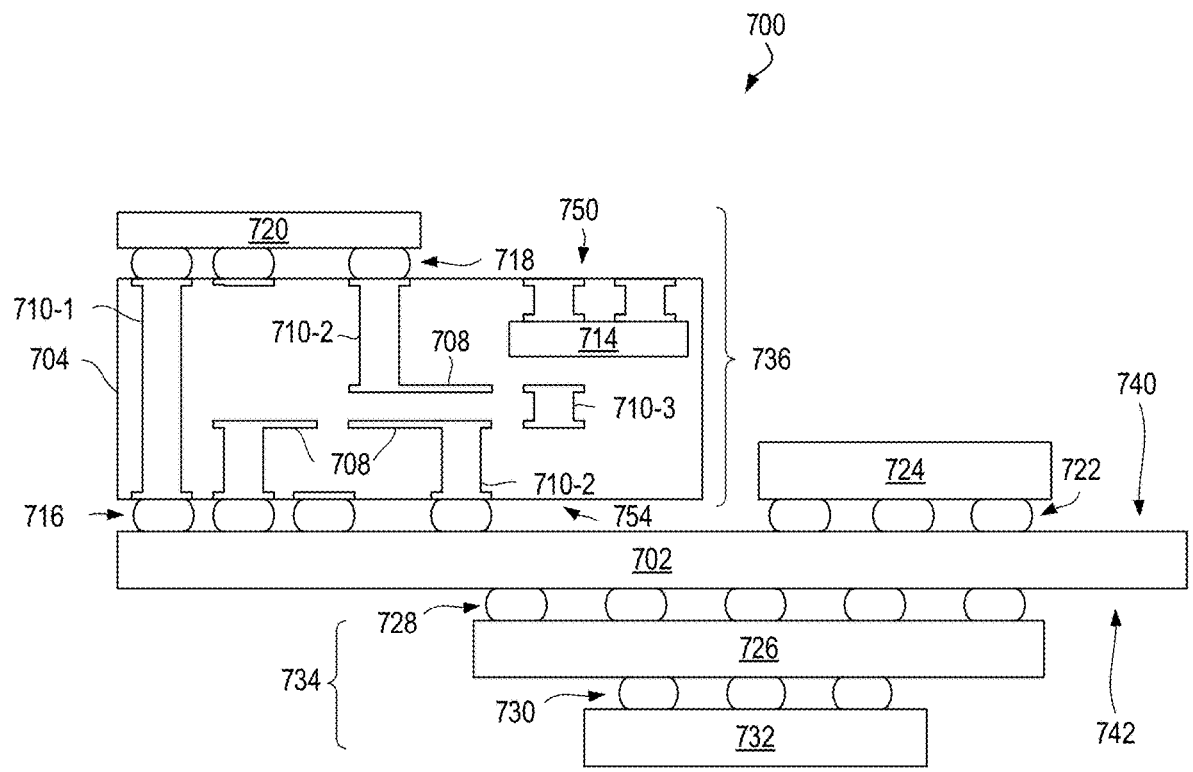
FIG. 7 is a cross-sectional side view of an integrated circuit device assembly that may include a microelectronic assembly, in accordance with any of the embodiments disclosed herein.

FIG. 7 is a cross-sectional side view of an integrated circuit device assembly 700 that may include any of the embodiments disclosed herein. In some embodiments, the integrated circuit device assembly 700 may be a microelectronic assembly. The integrated circuit device assembly 700 includes a number of components disposed on a circuit board 702 (which may be a motherboard, system board, mainboard, etc.). The integrated circuit device assembly 700 includes components disposed on a first face 740 of the circuit board 702 and an opposing second face 742 of the circuit board 702; generally, components may be disposed on one or both faces 740 and 742. Any of the integrated circuit components discussed below with reference to the integrated circuit device assembly 700 may take the form of any suitable ones of the embodiments of the microelectronic assemblies 100 disclosed herein.

In some embodiments, the circuit board 702 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate. The integrated circuit device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 716 may serve as the coupling components illustrated or described for any of the substrate assembly or substrate assembly components described herein, as appropriate.

The package-on-interposer structure 736 may include an integrated circuit component 720 coupled to an interposer 704 by coupling components 718. The coupling components 718 may take any suitable form for the application, such as the forms discussed above with reference to the coupling components 716. Although a single integrated circuit component 720 is shown in FIG. 7, multiple integrated circuit components may be coupled to the interposer 704; indeed, additional interposers may be coupled to the interposer 704. The interposer 704 may provide an intervening substrate used to bridge the circuit board 702 and the integrated circuit component 720.

The integrated circuit component 720 may be a packaged or unpacked integrated circuit product that includes one or more integrated circuit dies (e.g., the die 502 of FIG. 5, the integrated circuit device 600 of FIG. 6) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 720, a single monolithic integrated circuit die comprises solder bumps attached to contacts on the die. The solder bumps allow the die to be directly attached to the interposer 704. The integrated circuit component 720 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 720 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 720 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 720 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 704 may spread connections to a wider pitch or reroute a connection to a different connection. For example, the interposer 704 may couple the integrated circuit component 720 to a set of ball grid array (BGA) conductive contacts of the coupling components 716 for coupling to the circuit board 702. In the embodiment illustrated in FIG. 7, the integrated circuit component 720 and the circuit board 702 are attached to opposing sides of the interposer 704; in other embodiments, the integrated circuit component 720 and the circuit board 702 may be attached to a same side of the interposer 704. In some embodiments, three or more components may be interconnected by way of the interposer 704.

In some embodiments, the interposer 704 may be formed as a PCB, including multiple metal layers separated from one another by layers of dielectric material and interconnected by electrically conductive vias. In some embodiments, the interposer 704 may be formed of an epoxy resin, a fiberglass-reinforced epoxy resin, an epoxy resin with inorganic fillers, a ceramic material, or a polymer material such as polyimide. In some embodiments, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through hole vias 710-1 (that extend from a first face 750 of the interposer 704 to a second face 754 of the interposer 704), blind vias 710-2 (that extend from the first or second faces 750 or 754 of the interposer 704 to an internal metal layer), and buried vias 710-3 (that connect internal metal layers).

In some embodiments, the interposer 704 can comprise a silicon interposer. Through silicon vias (TSV) extending through the silicon interposer can connect connections on a first face of a silicon interposer to an opposing second face of the silicon interposer. In some embodiments, an interposer 704 comprising a silicon interposer can further comprise one or more routing layers to route connections on a first face of the interposer 704 to an opposing second face of the interposer 704.

The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art. In embodiments where the interposer is a non-printed circuit board The integrated circuit device assembly 700 may include an integrated circuit component 724 coupled to the first face 740 of the circuit board 702 by coupling components 722. The coupling components 722 may take the form of any of the embodiments discussed above with reference to the coupling components 716, and the integrated circuit component 724 may take the form of any of the embodiments discussed above with reference to the integrated circuit component 720.

The integrated circuit device assembly 700 illustrated in FIG. 7 includes a package-on-package structure 734 coupled to the second face 742 of the circuit board 702 by coupling components 728. The package-on-package structure 734 may include an integrated circuit component 726 and an integrated circuit component 732 coupled together by coupling components 730 such that the integrated circuit component 726 is disposed between the circuit board 702 and the integrated circuit component 732. The coupling components 728 and 730 may take the form of any of the embodiments of the coupling components 716 discussed above, and the integrated circuit components 726 and 732 may take the form of any of the embodiments of the integrated circuit component 720 discussed above. The package-on-package structure 734 may be configured in accordance with any of the package-on-package structures known in the art.

Figure 8:
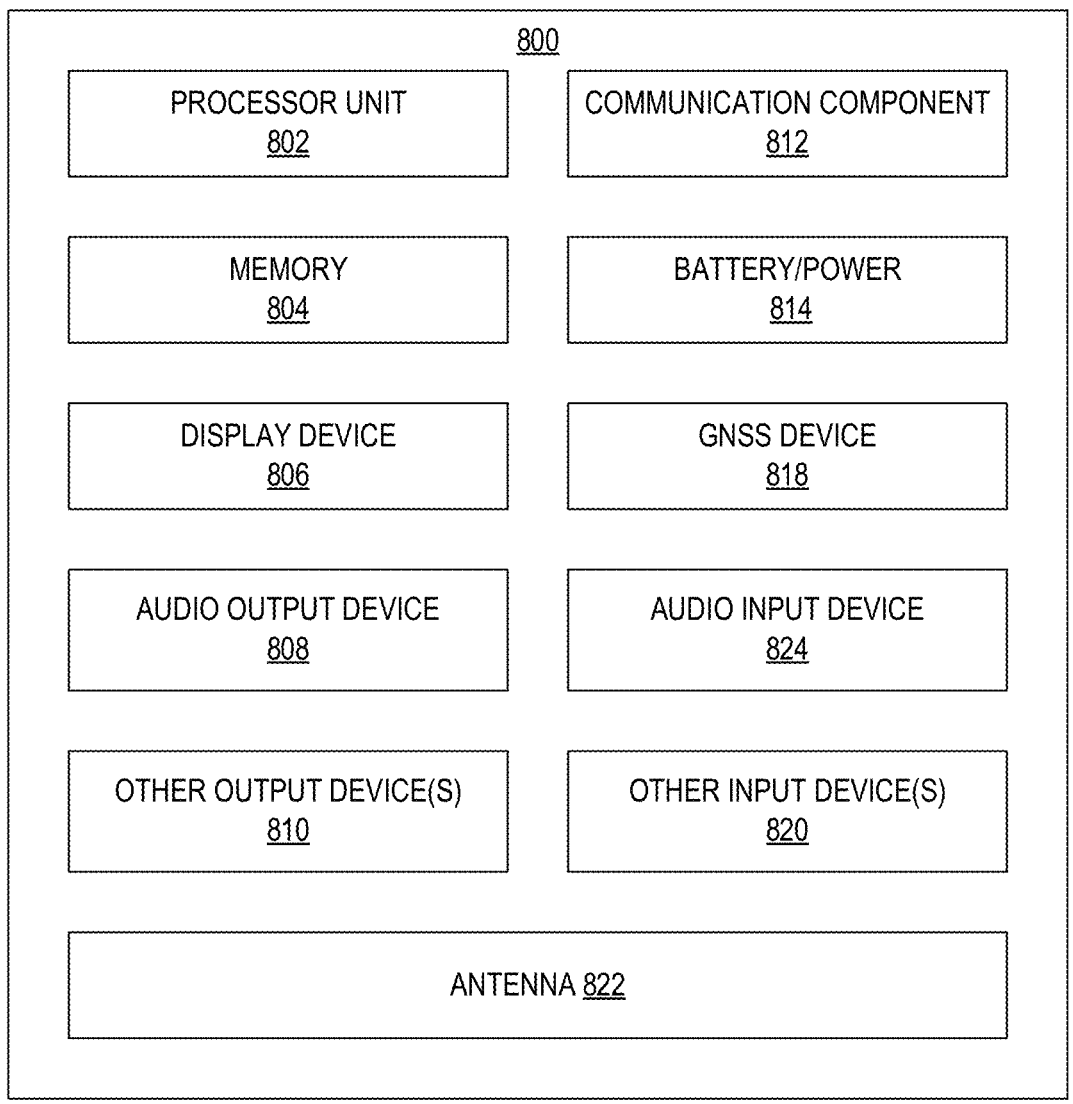
FIG. 8 is a block diagram of an example electrical device that may include a microelectronic assembly, in accordance with any of the embodiments disclosed herein.

FIG. 8 is a block diagram of an example electrical device 800 that may include one or more of the embodiments disclosed herein. For example, the electrical device 800 and/or its respective components (e.g., communication components 812, processor units 802, memory 804) may include one or more of the magnetoelectric spin-orbital (MESO) devices (e.g., MESO devices 100, 300), integrated circuit device assemblies 700, integrated circuit components 720, integrated circuit devices 600, or integrated circuit dies 502 disclosed herein. A number of components are illustrated in FIG. 8 as included in the electrical device 800, but any one or more of these components may be omitted or duplicated, as suitable for the application. In some embodiments, some or all of the components included in the electrical device 800 may be attached to one or more motherboards mainboards, or system boards. In some embodiments, one or more of these components are fabricated onto a single system-on-a-chip (SoC) die.

Additionally, in various embodiments, the electrical device 800 may not include one or more of the components illustrated in FIG. 8, but the electrical device 800 may include interface circuitry for coupling to the one or more components. For example, the electrical device 800 may not include a display device 806, but may include display device interface circuitry (e.g., a connector and driver circuitry) to which a display device 806 may be coupled. In another set of examples, the electrical device 800 may not include an audio input device 824 or an audio output device 808, but may include audio input or output device interface circuitry (e.g., connectors and supporting circuitry) to which an audio input device 824 or audio output device 808 may be coupled.

The electrical device 800 may include one or more processor units 802 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 802 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 800 may include a memory 804, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 804 may include memory that is located on the same integrated circuit die as the processor unit 802. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 800 can comprise one or more processor units 802 that are heterogeneous or asymmetric to another processor unit 802 in the electrical device 800. There can be a variety of differences between the processing units 802 in a system in terms of a spectrum of metrics of merit including architectural, micro-architectural, thermal, power consumption characteristics, and the like. These differences can effectively manifest themselves as asymmetry and heterogeneity among the processor units 802 in the electrical device 800.

In some embodiments, the electrical device 800 may include a communication component 812 (e.g., one or more communication components). For example, the communication component 812 can manage wireless communications for the transfer of data to and from the electrical device 800. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 812 may operate in accordance with other wireless protocols in other embodiments. The electrical device 800 may include an antenna 822 to facilitate wireless communications and/or to receive other wireless communications (such as AM or FM radio transmissions).

In some embodiments, the communication component 812 may manage wired communications, such as electrical, optical, or any other suitable communication protocols (e.g., IEEE 802.3 Ethernet standards). As noted above, the communication component 812 may include multiple communication components. For instance, a first communication component 812 may be dedicated to shorter-range wireless communications such as Wi-Fi or Bluetooth, and a second communication component 812 may be dedicated to longer-range wireless communications such as global positioning system (GPS), EDGE, GPRS, CDMA, WiMAX, LTE, EV-DO, or others. In some embodiments, a first communication component 812 may be dedicated to wireless communications, and a second communication component 812 may be dedicated to wired communications.

The electrical device 800 may include battery/power circuitry 814. The battery/power circuitry 814 may include one or more energy storage devices (e.g., batteries or capacitors) and/or circuitry for coupling components of the electrical device 800 to an energy source separate from the electrical device 800 (e.g., AC line power).

The electrical device 800 may include a display device 806 (or corresponding interface circuitry, as discussed above). The display device 806 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 800 may include an audio output device 808 (or corresponding interface circuitry, as discussed above). The audio output device 808 may include any embedded or wired or wirelessly connected external device that generates an audible indicator, such speakers, headsets, or earbuds.

The electrical device 800 may include an audio input device 824 (or corresponding interface circuitry, as discussed above). The audio input device 824 may include any embedded or wired or wirelessly connected device that generates a signal representative of a sound, such as microphones, microphone arrays, or digital instruments (e.g., instruments having a musical instrument digital interface (MIDI) output). The electrical device 800 may include a Global Navigation Satellite System (GNSS) device 818 (or corresponding interface circuitry, as discussed above), such as a Global Positioning System (GPS) device. The GNSS device 818 may be in communication with a satellite-based system and may determine a geolocation of the electrical device 800 based on information received from one or more GNSS satellites, as known in the art.

The electrical device 800 may include other output device(s) 810 (or corresponding interface circuitry, as discussed above). Examples of the other output device(s) 810 may include an audio codec, a video codec, a printer, a wired or wireless transmitter for providing information to other devices, or an additional storage device.

The electrical device 800 may include other input device(s) 820 (or corresponding interface circuitry, as discussed above). Examples of the other input device(s) 820 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 800 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 800 may be any other electronic device that processes data. In some embodiments, the electrical device 800 may comprise multiple discrete physical components. Given the range of devices that the electrical device 800 can be manifested as in various embodiments, in some embodiments, the electrical device 800 can be referred to as a computing device or a computing system.

While the concepts of the present disclosure are susceptible to various modifications and alternative forms, specific embodiments thereof have been shown by way of example in the drawings and are described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features. Further, it should be understood that the various embodiments shown in the figures are illustrative representations and are not necessarily drawn to scale.

Moreover, the illustrations and/or descriptions of various embodiments may be simplified or approximated for ease of understanding, and as a result, they may not necessarily reflect the level of precision nor variation that may be present in actual embodiments. For example, while some figures generally indicate straight lines, right angles, and smooth surfaces, actual implementations of the disclosed embodiments may have less than perfect straight lines and right angles, and some features may have surface topography or otherwise be non-smooth, given real-world limitations of fabrication processes. Similarly, illustrations and/or descriptions of how components are arranged may be simplified or approximated for ease of understanding and may vary by some margin of error in actual embodiments (e.g., due to fabrication processes, etc.).

The terms "substantially," "close," "approximately," "near," and "about" may refer to being within +/−10% of a target value unless otherwise specified.

Similarly, terms describing spatial relationships, such as "perpendicular," "orthogonal," or "coplanar," may refer to being substantially within the described spatial relationships (e.g., within +/−10 degrees of orthogonality).

Certain terminology may also be used in the foregoing description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In some embodiments, the phrase "A is located on B" or the phrase "A is adjacent to B" means that at least a part of A is in direct physical contact or indirect physical contact (having one or more other features between A and B) with at least a part of B. Moreover, the phrase "B is between A and C" means that at least part of B is in or along a space separating A and C and that the at least part of B is in direct or indirect physical contact with A and C.

The terms "coupled" and "connected" may refer to either a direct or indirect connection, such as a direct electrical, mechanical, or magnetic connection, or an indirect connection through one or more passive or active intermediary elements, components, or devices.

The phrases "in an embodiment," "according to some embodiments," "in accordance with embodiments," "in embodiments," and the like may each refer to one or more of the same or different embodiments.

The terms "comprises," "comprising," "includes," "including," "having" and the like specify the presence of the stated elements (e.g., features, components, materials, steps, operations) but do not preclude the presence or addition of one or more other elements.

The phrase "and/or" as used herein refers to and encompasses any and all possible combinations of one or more of the associated listed items.

The singular forms "a," "an," and "the" are intended to include the plural forms as well, unless the context clearly indicates otherwise. For example, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

For purposes of some embodiments, the transistors in various circuits and logic blocks described herein may be metal oxide semiconductor (MOS) transistors or their derivatives, where the MOS transistors include drain, source, gate, and bulk terminals. The transistors and/or the MOS transistor derivatives also include Tri-Gate and Fin-FET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.). Moreover, in some embodiments, spintronic logic devices (e.g., magnetoelectric spin-orbit (MESO) logic devices) may be used in addition to, or as an alternative to, MOS transistors.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc., as dictated by design needs or preferences, may actually comprise one or more signals that may travel in either direction and may be implemented with any suitable type of signal scheme.

In the foregoing description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the art. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine, including volatile or non-volatile memory (e.g., random access memory (RAM), flash memory), hard drives (e.g., hard disk drive (HDD), solid state drive (SSD)), media discs, or combination thereof.

Example Embodiments

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 includes an integrated circuit die, comprising: a first layer comprising a magnetoelectric material; a second layer comprising a monolayer transition metal dichalcogenide (TMD); a magnet between the first layer and the second layer, wherein the magnet has perpendicular magnetic anisotropy; a first conductive trace coupled to the first layer; and a second conductive trace coupled to the magnet.

Example 2 includes the integrated circuit die of Example 1, wherein the second layer has two output legs, wherein the output legs extend from different sides of the second layer and are substantially perpendicular to a remainder of the second layer.

Example 3 includes the integrated circuit die of Example 2, wherein: the first conductive trace is further coupled to an input voltage terminal; the second conductive trace is further coupled to a supply voltage terminal; the second layer is coupled to ground; and the output legs are coupled to differential output voltage terminals.

Example 4 includes the integrated circuit die of Example 3, wherein: the output legs comprise a first output leg and a second output leg; the differential output voltage terminals comprise a positive output voltage terminal and a negative output voltage terminal; and the first output leg is coupled to the positive output voltage terminal and the second output leg is coupled to the negative output voltage terminal.

Example 5 includes the integrated circuit die of any of Examples 3-4, wherein: the first layer is to convert an input charge current on the first conductive trace into a spin current on the magnet; and the second layer is to convert the spin current on the magnet into an output charge current on the output legs.

Example 6 includes the integrated circuit die of any of Examples 1-5, wherein the monolayer TMD comprises a p-type monolayer TMD.

Example 7 includes the integrated circuit die of any of Examples 1-6, wherein the monolayer TMD comprises: tungsten and selenium; or tungsten and sulfur.

Example 8 includes the integrated circuit die of any of Examples 1-7, wherein the magnet comprises: cobalt, iron, boron, magnesium, and oxygen; cobalt and platinum; cobalt and palladium; cobalt and nickel; or gallium and tellurium.

Example 9 includes the integrated circuit die of any of Examples 1-8, wherein the magnetoelectric material comprises: bismuth, iron, and oxygen; lanthanum, bismuth, iron, and oxygen; lutetium, iron, and oxygen; bismuth, titanium, and oxygen; terbium, manganese, and oxygen; iron and gallium; terbium, dysprosium, and iron; iron and rhodium; chromium and oxygen; or iron, tellurium, and oxygen.

Example 10 includes the integrated circuit die of any of Examples 1-9, further comprising a magnetoelectric spin-orbit (MESO) device, wherein the MESO device comprises the first layer, the second layer, the magnet, the first conductive trace, and the second conductive trace.

Example 11 includes an electronic device, comprising: processing circuitry; memory circuitry; or communication circuitry; wherein the processing circuitry, the memory circuitry, or the communication circuitry comprises one or more magnetoelectric spin-orbit (MESO) devices, wherein individual MESO devices comprise: a first layer comprising a magnetoelectric material; a second layer comprising a monolayer transition metal dichalcogenide (TMD); a magnet between the first layer and the second layer, wherein the magnet has perpendicular magnetic anisotropy; a first conductive trace coupled to the first layer; and a second conductive trace coupled to the magnet.

Example 12 includes the electronic device of Example 11, wherein the second layer has two output legs, wherein the output legs extend from different sides of the second layer and are substantially perpendicular to a remainder of the second layer.

Example 13 includes the electronic device of Example 12, wherein: the first conductive trace is further coupled to an input voltage terminal; the second conductive trace is further coupled to a supply voltage terminal; the second layer is coupled to ground; and the output legs are coupled to differential output voltage terminals.

Example 14 includes the electronic device of any of Examples 11-13, wherein the monolayer TMD comprises a p-type monolayer TMD.

Example 15 includes the electronic device of Example 14, wherein the p-type monolayer TMD comprises: tungsten and selenium; or tungsten and sulfur.

Example 16 includes the electronic device of any of Examples 11-15, wherein: the magnet comprises: cobalt, iron, boron, magnesium, and oxygen; cobalt and platinum; cobalt and palladium; cobalt and nickel; or gallium and tellurium; and the magnetoelectric material comprises: bismuth, iron, and oxygen; lanthanum, bismuth, iron, and oxygen; lutetium, iron, and oxygen; bismuth, titanium, and oxygen; terbium, manganese, and oxygen; iron and gallium; terbium, dysprosium, and iron; iron and rhodium; chromium and oxygen; or iron, tellurium, and oxygen.

Example 17 includes a method of fabricating a magnetoelectric spin-orbit device, comprising: forming a first conductive trace; forming a first layer above the first conductive trace, wherein the first layer comprises a magnetoelectric material; forming a magnet above the first layer, wherein the magnet has perpendicular magnetic anisotropy; forming a second layer above the magnet, wherein the second layer comprises a monolayer transition metal dichalcogenide (TMD); and forming a second conductive trace above the magnet.

Example 18 includes the method of Example 17, wherein forming the second layer above the magnet comprises: forming a body of the second layer above the magnet; and forming two output legs on different sides of the body, wherein the output legs are substantially perpendicular to the body.

Example 19 includes the method of any of Examples 17-18, wherein the monolayer TMD comprises a p-type monolayer TMD.

Example 20 includes the method of Example 19, wherein the p-type monolayer TMD comprises: tungsten and selenium; or tungsten and sulfur.

The invention claimed is:

1. An integrated circuit die, comprising:
   a first layer comprising a magnetoelectric material;
   a second layer comprising a monolayer transition metal dichalcogenide (TMD);
   a magnet between the first layer and the second layer, wherein the magnet has perpendicular magnetic anisotropy;
   a first conductive trace coupled to the first layer; and
   a second conductive trace coupled to the magnet.

2. The integrated circuit die of claim 1, wherein the second layer has two output legs, wherein the output legs extend from different sides of the second layer and are substantially perpendicular to a remainder of the second layer.

3. The integrated circuit die of claim 2, wherein:
   the first conductive trace is further coupled to an input voltage terminal;
   the second conductive trace is further coupled to a supply voltage terminal;
   the second layer is coupled to ground; and
   the output legs are coupled to differential output voltage terminals.

4. The integrated circuit die of claim 3, wherein:
   the output legs comprise a first output leg and a second output leg;
   the differential output voltage terminals comprise a positive output voltage terminal and a negative output voltage terminal; and
   the first output leg is coupled to the positive output voltage terminal and the second output leg is coupled to the negative output voltage terminal.

5. The integrated circuit die of claim 3, wherein:
   the first layer is to convert an input charge current on the first conductive trace into a spin current on the magnet; and
   the second layer is to convert the spin current on the magnet into an output charge current on the output legs.

6. The integrated circuit die of claim 1, wherein the monolayer TMD comprises a p-type monolayer TMD.

7. The integrated circuit die of claim 1, wherein the monolayer TMD comprises:

tungsten and selenium; or
tungsten and sulfur.

8. The integrated circuit die of claim 1, wherein the magnet comprises:
cobalt, iron, boron, magnesium, and oxygen;
cobalt and platinum;
cobalt and palladium;
cobalt and nickel; or
gallium and tellurium.

9. The integrated circuit die of claim 1, wherein the magnetoelectric material comprises:
bismuth, iron, and oxygen;
lanthanum, bismuth, iron, and oxygen;
lutetium, iron, and oxygen;
bismuth, titanium, and oxygen;
terbium, manganese, and oxygen;
iron and gallium;
terbium, dysprosium, and iron;
iron and rhodium;
chromium and oxygen; or
iron, tellurium, and oxygen.

10. The integrated circuit die of claim 1, further comprising a magnetoelectric spin-orbit (MESO) device, wherein the MESO device comprises the first layer, the second layer, the magnet, the first conductive trace, and the second conductive trace.

11. An electronic device, comprising:
processing circuitry;
memory circuitry; or
communication circuitry;
wherein the processing circuitry, the memory circuitry, or the communication circuitry comprises one or more magnetoelectric spin-orbit (MESO) devices, wherein individual MESO devices comprise:
a first layer comprising a magnetoelectric material;
a second layer comprising a monolayer transition metal dichalcogenide (TMD);
a magnet between the first layer and the second layer, wherein the magnet has perpendicular magnetic anisotropy;
a first conductive trace coupled to the first layer; and
a second conductive trace coupled to the magnet.

12. The electronic device of claim 11, wherein the second layer has two output legs, wherein the output legs extend from different sides of the second layer and are substantially perpendicular to a remainder of the second layer.

13. The electronic device of claim 12, wherein:
the first conductive trace is further coupled to an input voltage terminal;
the second conductive trace is further coupled to a supply voltage terminal;
the second layer is coupled to ground; and
the output legs are coupled to differential output voltage terminals.

14. The electronic device of claim 11, wherein the monolayer TMD comprises a p-type monolayer TMD.

15. The electronic device of claim 14, wherein the p-type monolayer TMD comprises:
tungsten and selenium; or
tungsten and sulfur.

16. The electronic device of claim 11, wherein:
the magnet comprises:
cobalt, iron, boron, magnesium, and oxygen;
cobalt and platinum;
cobalt and palladium;
cobalt and nickel; or
gallium and tellurium; and
the magnetoelectric material comprises:
bismuth, iron, and oxygen;
lanthanum, bismuth, iron, and oxygen;
lutetium, iron, and oxygen;
bismuth, titanium, and oxygen;
terbium, manganese, and oxygen;
iron and gallium;
terbium, dysprosium, and iron;
iron and rhodium;
chromium and oxygen; or
iron, tellurium, and oxygen.

17. A method of fabricating a magnetoelectric spin-orbit device, comprising:
forming a first conductive trace;
forming a first layer above the first conductive trace, wherein the first layer comprises a magnetoelectric material;
forming a magnet above the first layer, wherein the magnet has perpendicular magnetic anisotropy;
forming a second layer above the magnet, wherein the second layer comprises a monolayer transition metal dichalcogenide (TMD); and
forming a second conductive trace above the magnet.

18. The method of claim 17, wherein forming the second layer above the magnet comprises:
forming a body of the second layer above the magnet; and
forming two output legs on different sides of the body, wherein the output legs are substantially perpendicular to the body.

19. The method of claim 17, wherein the monolayer TMD comprises a p-type monolayer TMD.

20. The method of claim 19, wherein the p-type monolayer TMD comprises:
tungsten and selenium; or
tungsten and sulfur.

* * * * *